(12) United States Patent
Kihara et al.

(10) Patent No.: US 7,692,763 B2
(45) Date of Patent: Apr. 6, 2010

(54) EXPOSURE APPARATUS

(75) Inventors: Takeo Kihara, Utsunomiya (JP); Issei Funayoshi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 847 days.

(21) Appl. No.: 11/387,684

(22) Filed: Mar. 24, 2006

(65) Prior Publication Data

US 2006/0216025 A1 Sep. 28, 2006

(30) Foreign Application Priority Data

Mar. 25, 2005 (JP) ............... 2005-087710

(51) Int. Cl.
*G03B 27/42* (2006.01)
(52) U.S. Cl. ............... 355/53; 355/77; 396/611
(58) Field of Classification Search ............... 430/322; 355/30, 53
See application file for complete search history.

(56) References Cited

U.S. PATENT DOCUMENTS

| 4,750,141 A | * | 6/1988 | Judell et al. ............... 702/95 |
| 5,337,151 A | * | 8/1994 | Baxter et al. ............... 356/401 |
| 6,519,024 B2 | * | 2/2003 | Hirano ............... 355/55 |

* cited by examiner

*Primary Examiner*—Alan A Mathews
*Assistant Examiner*—Mesfin T Asfaw
(74) *Attorney, Agent, or Firm*—Fitzpatrick, Cella, Harper & Scinto

(57) ABSTRACT

A device manufacturing apparatus includes a conveying device which conveys a substrate, an acquiring device to acquire an amount of warpage of the substrate, based on a measurement or an input, a storing device which stores a database representing a correspondence between a parameter related to a conveying condition and the warpage amount of the substrate, and a controller which controls, based on the database, the conveying device to convey the substrate in accordance with a parameter corresponding to the warpage amount acquired by the acquiring device.

9 Claims, 5 Drawing Sheets

EXPOSURE APPARATUS

This application claims priority from Japanese Patent Application No. 2005-087710, filed Mar. 25, 2005, which is hereby incorporated by reference.

FIELD OF THE INVENTION AND RELATED ART

This invention relates to a device manufacturing apparatus, such as an exposure apparatus, for example, for use in the manufacture of various devices, such as semiconductor chips (ICs, LSIs, etc.), liquid crystal panels, CCDs, thin-film magnetic heads, or micromachines, for example, having very fine patterns.

In semiconductor exposure apparatuses used in the manufacture of semiconductor devices, a wafer conveying hand, a prealignment stage and a wafer stage are arranged, respectively, to convey a wafer while holding the same by means of a vacuum pressure. Here, the wafer conveying hand is used to load a wafer onto the wafer stage and to unload the wafer from the wafer stage. The prealignment stage is configured to perform alignment of the wafer by using a notch or an orientation flat formed on the wafer, before the wafer is moved to the wafer stage. Here, the moving speed and the reduced pressure level, as well as a reduced pressure threshold, are constant, regardless of the shape of the wafer.

The surface shape of the wafer, as the same is held by vacuum suction by means of a wafer chuck, is measured by use of a focus sensor. On the basis of the shape measured, the wafer surface is brought into registration with a focus position, and the exposure process is carried out.

Currently, in place of conventional exposure apparatuses, called steppers, wherein an exposure region having an approximately square shape is simultaneously projected on a wafer in a reduced scale, exposure apparatuses, called scanners, wherein the exposure region has a rectangular slit-like shape and, by relatively scanningly moving a reticle and a wafer at a high speed, a large field is exposed precisely, are used prevalently.

Exposure shots on a wafer are brought into alignment with a reticle by optically detecting positions of alignment marks associated with these exposure shots, having been transferred onto the wafer simultaneously, as a circuit pattern of the reticle is transferred thereto, and then, by positioning the wafer with respect to the reticle on the basis of the results of the detection. Usually, advanced global alignment (AGA) is carried out. The AGA refers to a global alignment process in which the position of a wafer is measured while relying upon the precision of an X-Y stage having a laser interferometer. Alignment marks to be used for this AGA measurement have the same shape regardless of the shape of the wafer.

As the integration of semiconductor devices progresses, wiring elements are miniaturized, or they are formed in multiple layers. The multiple-layering of wiring elements may cause an undesirable phenomenon that, at later stages of semiconductor manufacturing processes, film distortions produced during film formation are accumulated to cause warp of a wafer as a whole. In some cases, the amount of such wafer warp is too large, which causes droppage of a wafer, or a wafer conveyance error, and the sequential operation has to be stopped thereby.

Furthermore, if the wafer warp goes on, local distortion will be produced in the wafer held on a wafer chuck, which will in turn adversely affect the AGA measurement or scan exposure.

SUMMARY OF THE INVENTION

It is accordingly an object of the present invention to provide measures effective to avoid or reduce inconveniences described above.

In accordance with an aspect of the present invention, there is provided a device manufacturing apparatus, the improvements residing in means for changing a condition in a process related to device manufacture, on the basis of a warp of a substrate used to constitute a device.

In accordance with the present invention, a substrate moving speed, an attraction pressure, scan parameters during an exposure process, and so on, corresponding to the amount of warp of the substrate produced in any preceding processes can be switched or newly set appropriately. This effectively avoids dropping of the substrate, or any conveyance error. Additionally, this enables correction of any local distortion due to warpage of the wafer.

Furthermore, alignment marks to be used for the AGA measurement can be chosen in accordance with the amount of warp of the substrate. This leads to improved precision of AGA measurement, on one hand, and avoids the necessity of measuring the surface of the substrate by use of a focus sensor, on the other hand. The throughput will be improved thereby.

These and other objects, features and advantages of the present invention, will become more apparent upon a consideration of the following description of the preferred embodiments of the present invention, taken in conjunction with the accompanying drawings.

DESCRIPTION OF THE PREFERRED EMBODIMENTS

Figure 1:
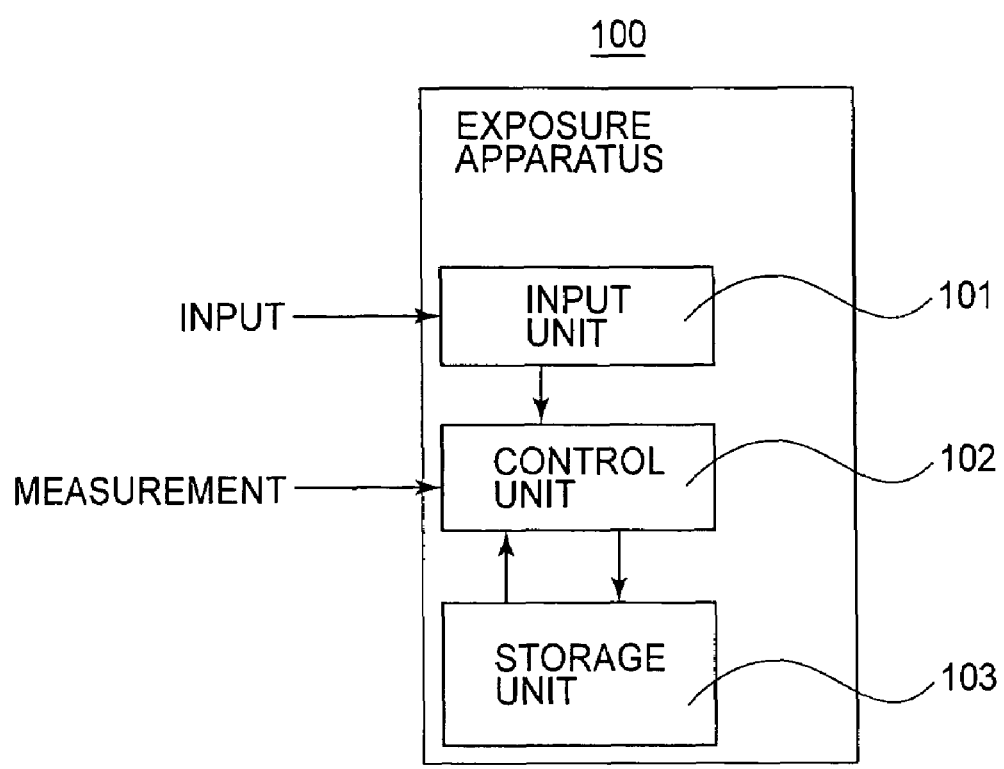
FIG. 1 is a diagrammatic view of an exposure apparatus according to an embodiment of the present invention.

Device manufacturing apparatuses according to preferred embodiments of the present invention may include a semiconductor exposure apparatus, such as a scanning exposure apparatus, and a semiconductor manufacturing apparatus (system), in which a semiconductor exposure apparatus and coater developers are in-line connected. In these examples, the substrate mentioned above may be a semiconductor wafer. Namely, a semiconductor exposure apparatus according to one preferred embodiment of the present invention may be featured that the amount of warp of a wafer produced during a process or processes can be measured or inputted as a process parameter, with respect to each lot of wafers or each wafer of the same lot.

In accordance with the amount of wafer warp determined with this arrangement, correction quantities for parameters, such as a driving speed of a robot of a conveyance system, a reduced pressure level or a reduced pressure threshold level, for example, corresponding to the wafer warp amount, may be calculated, and the results of calculation may be stored as a database. By using this database, various parameters, such as the driving speed of a conveyance system robot, such as a wafer stage, a conveyance robot of a wafer conveyance system, or a prealignment stage, for example, a reduced pressure level, and a reduced pressure threshold level, or the like, may be switched, or newly set. This will effectively avoid or reduce dropping of a wafer or a conveyance error, for example.

One preferred embodiment of the present invention may include a mechanism for predicting an amount of local distortion of a wafer to be produced by any residual flatness error, remaining after flatness correction upon a wafer chuck by negative-pressure attraction, or a position of distortion within the wafer, in accordance with the amount of wafer warp. One preferred embodiment may further comprise a mechanism or a sequence for correcting the distortion, by changing a scan speed or a scan parameter, on the basis of the predicted amount of distortion or predicted distortion position.

One preferred embodiment of the present invention may comprise a mechanism or a sequence for discriminating, on the basis of the predicted distortion amount or the predicted position of distortion inside the wafer, whether the distortion can be corrected through a scan exposure sequence, and a mechanism or a sequence for notifying the practicability of a process for a wafer lot or each wafer in the lot, before a start of the process.

One preferred embodiment of the present invention may be featured in that, on the basis of the amount of wafer warp, the amount of local distortion or the position of distortion inside a wafer to be produced by any residual flatness error, remaining after flatness correction upon a wafer chuck by negative-pressure attraction, is predicted and, then, an optimum shot region or regions to be used for the AGA measurement are chosen automatically. This is very advantageous in that the precision of AGA measurement is improved significantly and that, since it avoids the necessity of wafer surface-shape measurement by using a focus sensor, the throughput increases considerably.

Preferred embodiments of the present invention will now be described with reference to the attached drawings.

Embodiment 1

FIG. 1 shows a semiconductor exposure apparatus according to an embodiment of the present invention. In FIG. 1, the exposure apparatus generally denoted at 100 includes a control unit 102 for controlling various component systems that constitute the exposure apparatus, an input unit 101 through which exposure conditions, and so on, are inputted into the exposure apparatus, and a storage unit 103 for storing therein pre-measurement data, for example. Examples of component systems to be controlled by the control unit 102 are a stage system, an alignment system for measuring the position of a pattern of a wafer, and a conveyance system for conveying a wafer.

Figure 2:
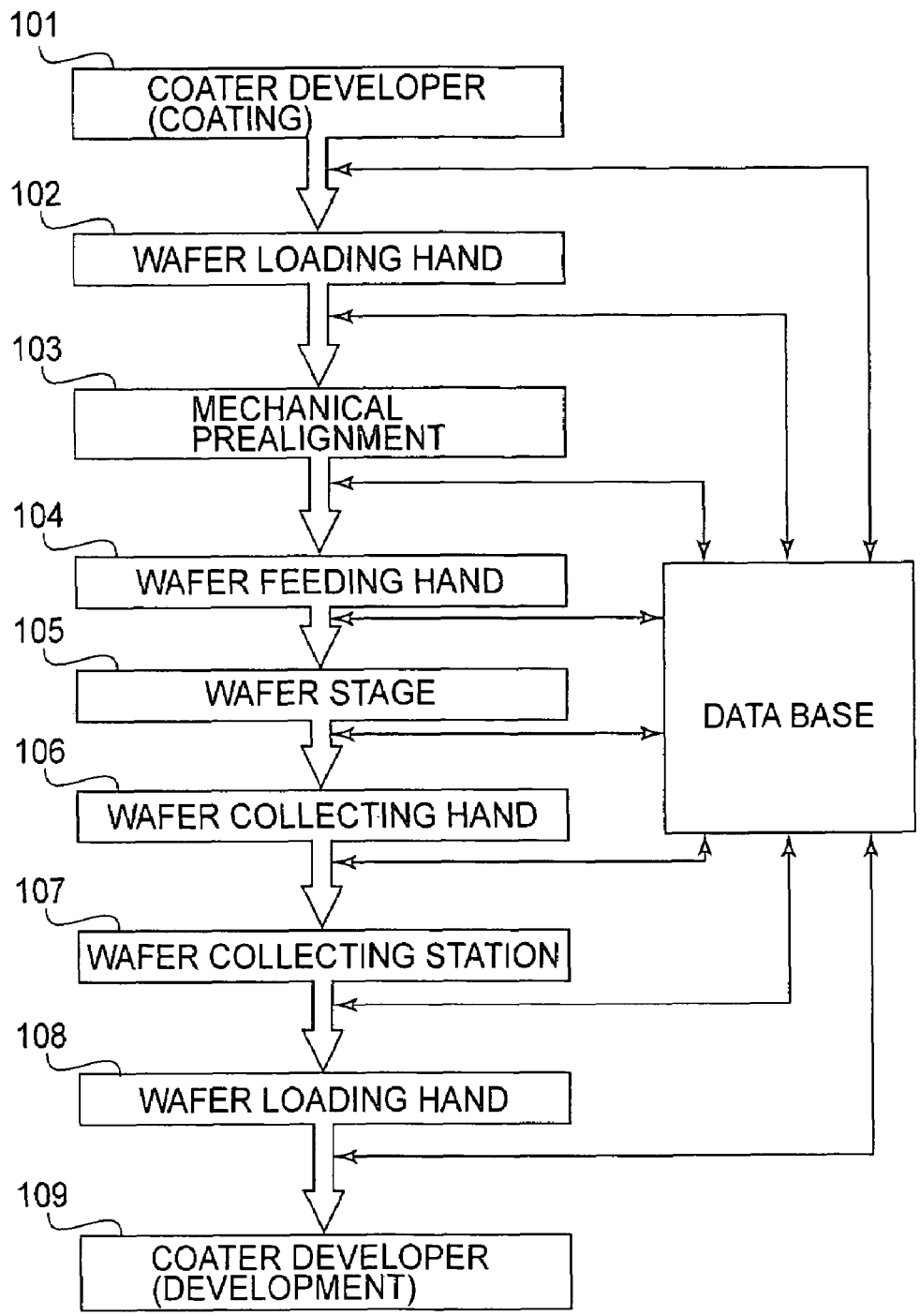
FIG. 2 is a diagrammatic view for explaining wafer conveying sequential operations according to an embodiment of the present invention.

FIG. 2 is a diagrammatic view illustrating a wafer conveyance sequential procedure, wherein a wafer conveying system is controlled by the control unit 102 and in accordance with a database stored in the storage unit 103. This embodiment of the present invention will be explained in greater detail, with reference to these drawings.

In a coater developer, a wafer is coated with a resist material (Step 101), and thereafter, the wafer is held on an in-line unit configured to transfer a wafer between the coater developer and a wafer conveyance system.

Subsequently, with respect to each wafer lot or each of the wafers in the same lot, the amount of warp of a wafer is measured inside or outside the exposure apparatus, in accordance with a shape measuring method using a laser displacement gauge or an interferometer, for example. If, on that occasion, there is even wafer warpage in the same lot, measurement may preferably be made in the unit of a wafer lot, for a higher throughput. Alternatively, if an approximate warp amount is predetected by some means, corresponding data may be directly inputted into the input unit 101, such as an interface, for example.

Here, referring to FIGS. 3A-3C, the amount of wafer warpage will be explained in detail.

Generally, as the semiconductor manufacturing procedure goes on through different processes, film distortion will be produced in the wafer 1, which may be even in the same lot, due to compressive stresses applied to the wafer by film formation or etching. On that occasion, a produced deformation will have a dish-like shape, as shown in FIG. 3A, or a hat-like shape, as shown in FIG. 3B. If the stress is different with the position, many varieties of deformations may be produced. An example is a wavy shape, as shown in FIG. 3C.

Figure 3A:
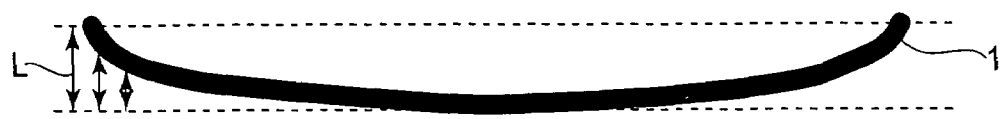
FIGS. 3A-3C are schematic views, respectively, for explaining AGA measurement in an embodiment of the present invention.
Figure 3B:
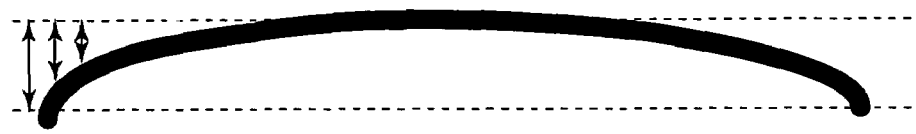
Figure 3C:

Hence, first of all, information about which one of those shown in FIGS. 3A, 3B and 3C, the current wafer shape corresponding to or is most analogous to, is switched or set beforehand. In cases of a dish-like shape or hat-like shape, a parameter, such as the warpage amount L of wafer 1, may be used. In cases of a wavy shape, the wafer surface shape may be mapped and deformation amounts in different regions may be used as a parameter.

Subsequently, the control unit 102 operates to discriminate whether the wafer can be safely conveyed within the apparatus or not, on the basis of the amount of wafer warpage having been measured or inputted, and a specific discrimination quantity having been stored in the storage unit 103 of the apparatus. Furthermore, the control unit 102 operates to discriminate whether any residual component of flatness correction made by negative-pressure attraction upon a wafer chuck can be corrected, or not, up to a predetermined distortion residual having been set in the apparatus, by means of the scan exposure sequential procedure. The practicability or impracticability of the process is notified by the control unit 102 before a start of the wafer lot process. The discrimination quantity mentioned above may be determined in accordance with an actually measured value obtainable by experiments made to various warpage shapes, or it may be determined on the basis of theoretically analyzed values.

If the practicability of the wafer process is notified, then, parameters (conveyance conditions) for driving speeds of conveyance system robots, such as a wafer stage, a conveyance hand of a wafer conveyance system, a prealignment stage, and so on, and a reduced pressure level or a reduced pressure threshold level of them, as well as scan parameters (scan conditions), during the exposure process, are changed. More specifically, a database (data) concerning the interrelationship between the wafer warpage amount having been prepared and stored in the storage means and the parameters mentioned above is referenced, and the parameters are changed (switched or newly set) in accordance with the amount of wafer warpage. The database may be prepared in accordance with an actually measured value obtainable by experiments made to various warpage shapes, or it may be determined on the basis of theoretically analyzed values.

Subsequently, the wafer is held by fingers configured to hold a wafer by attraction during wafer conveyance, through a wafer loading hand, and the wafer is conveyed into a mechanical prealignment unit (Step 102). The moving speed of the wafer loading hand, as well as the reduced pressure level and the reduced pressure threshold level for the fingers correspond to the parameters switched or set as described above.

Then, in the mechanical prealignment unit, the wafer is held by vacuum suction on a prealignment stage by means of a prealignment chuck, and thereafter, the position of the wafer is adjusted with respect to X and Y directions by using a notch or an orientation flat of the wafer before the same is moved toward the wafer stage (Step 103). The driving speed of the prealignment stage, as well as the reduced pressure level and the reduced pressure threshold level of the prealignment chuck, correspond to the parameters switched or set, as described above.

After this, the wafer is held by fingers configured to hold a wafer by attraction during wafer conveyance through a wafer feeding hand, and the wafer is conveyed onto the wafer stage (Step 104). The moving speed of the wafer feeding hand, as well as the reduced pressure level and the reduced pressure threshold level for the fingers, correspond to the parameters switched or set, as described above.

Subsequently, on the wafer stage, the wafer is held by vacuum suction by means of a wafer chuck, and then, the exposure process is carried out while moving the wafer stage. The moving speed of the wafer stage, as well as the reduced pressure level and the reduced pressure threshold level for the wafer chuck, correspond to the parameters switched or set as described above (Step 105). Furthermore, during the exposure process, the scan parameters may be changed in accordance with the wafer distortion amount, to correct the distortion.

After the exposure is completed, the wafer is held by fingers configured to hold a wafer by attraction during wafer conveyance through a wafer collecting hand, and the wafer is conveyed to a wafer collecting station (Step 106). The moving speed of the wafer collecting hand, as well as the reduced pressure level and the reduced pressure threshold level for the fingers, correspond to the parameters switched or set, as described above.

Finally, the wafer is held by fingers configured to hold a wafer by attraction during wafer conveyance through a wafer loading hand, and the wafer is conveyed outwardly to an in-line unit (Step 108). The in-line unit then operates to move the wafer to a coater developer, by which the wafer conveyance sequence is completed (Step 109). The moving speed of the wafer loading hand, as well as the reduced pressure level and the reduced pressure threshold level for the fingers, correspond to the parameters switched or set as described above.

Embodiment 2

Figure 4:
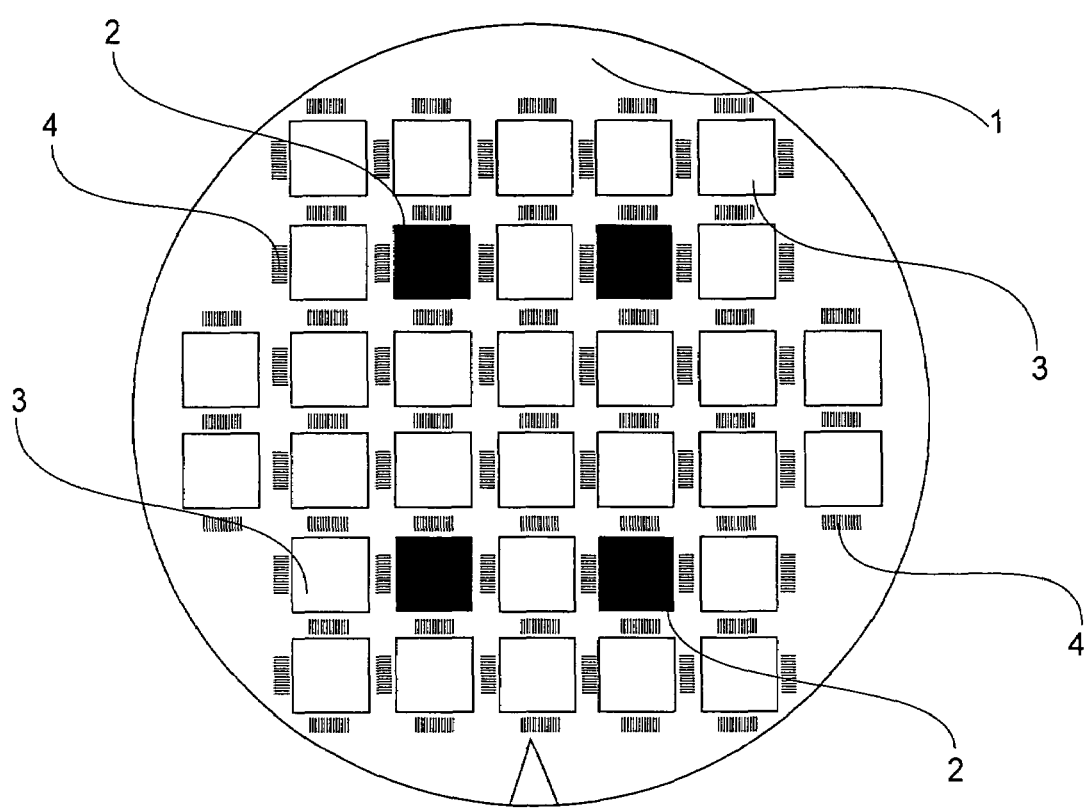
FIG. 4 is a schematic view for explaining alignment marks for particular sample shots to be used for the AGA measurement in a second embodiment of the present invention.

FIG. 4 is a schematic view for explaining alignment marks of particular sample shots to be used for the AGA measurement in accordance with a second embodiment of the present invention. In FIG. 4, denoted at 2 are those shot regions as chosen by the AGA measurement, and denoted by 3 are the other shot regions. Denoted at 4 are alignment patterns, and denoted at 1 is a semiconductor wafer.

The AGA measurement is a process in which the shot layout on a wafer is statistically calculated on the basis of alignment data of particular sample shots and, to this end, alignment marks 4 of some shot regions 2 are sequentially measured by using a wafer alignment scope while moving the wafer stage.

In this embodiment, the control unit 102 refers to the database stored in the storage unit 103 of the apparatus, in accordance with the amount of wafer warpage, and it predicts the shape of the wafer surface as held by vacuum attraction by means of the wafer chuck. The database used here may be prepared in accordance with an actually measured value of the wafer surface shape obtainable by measurements using a conventional focus sensor, or it may be prepared on the basis of theoretically analyzed values.

Subsequently, the control unit 102 predicts the amount of local distortion caused by any residual component of flatness correction through negative-pressure attraction of the wafer upon the wafer chuck, and/or the position of distortion inside the wafer, on the basis of the wafer shape as predicted.

Thereafter, the distortion amount of each of the wafer shot regions predicted as described above is compared with a threshold quantity concerning the distortion amount that does not influence the alignment measurement, having been stored in the storage unit of the apparatus, and alignment marks to be used for the AGA measurement are chosen automatically from those shot regions that satisfy the threshold level. This procedure assures precise AGA measurement in accordance with the amount of wafer warpage. Alignment marks of an arbitrary number (e.g., four) may be chosen for the AGA measurement, and the marks may be chosen from positions where distortion is small. Furthermore, in accordance with the amount of warpage, any deviation of the mark caused by the warpage may be corrected. On that occasion, the relationship between the amount of warp and the amount of deviation may be measured beforehand and stored into memory means in the form of a database.

In accordance with this embodiment of the present invention, the wafer conveying speed, the attracting pressure, or scan parameters during the exposure can be switched or set to optimum quantities in accordance with the amount of wafer warpage produced during the process or processes. This effectively prevents dropping of wafers or conveyance errors. Furthermore, local distortion of a wafer due to wafer warpage can be corrected. In addition to this, alignment marks to be used for the AGA measurement can be chosen in accordance with the amount of wafer warpage. This is very advantageous in that the precision of AGA measurement increases significantly and that, since it avoids the necessity of measuring the wafer surface shape by using a focus sensor, the throughput is improved considerably.

It should be noted here that, although the structures described above may preferably be used in an exposure apparatus, it is not a requirement, and they can be used in any other device manufacturing methods.

Embodiment 3

Next, an embodiment of a device manufacturing method, which uses an exposure apparatus for manufacturing microdevices, such as semiconductor chips (e.g., ICs and LSIs), liquid crystal panels, CCDs, thin-film magnetic heads or micromachines, for example, in accordance with the sequential procedure shown in the flow chart of FIG. 2, will be explained.

Figure 5:
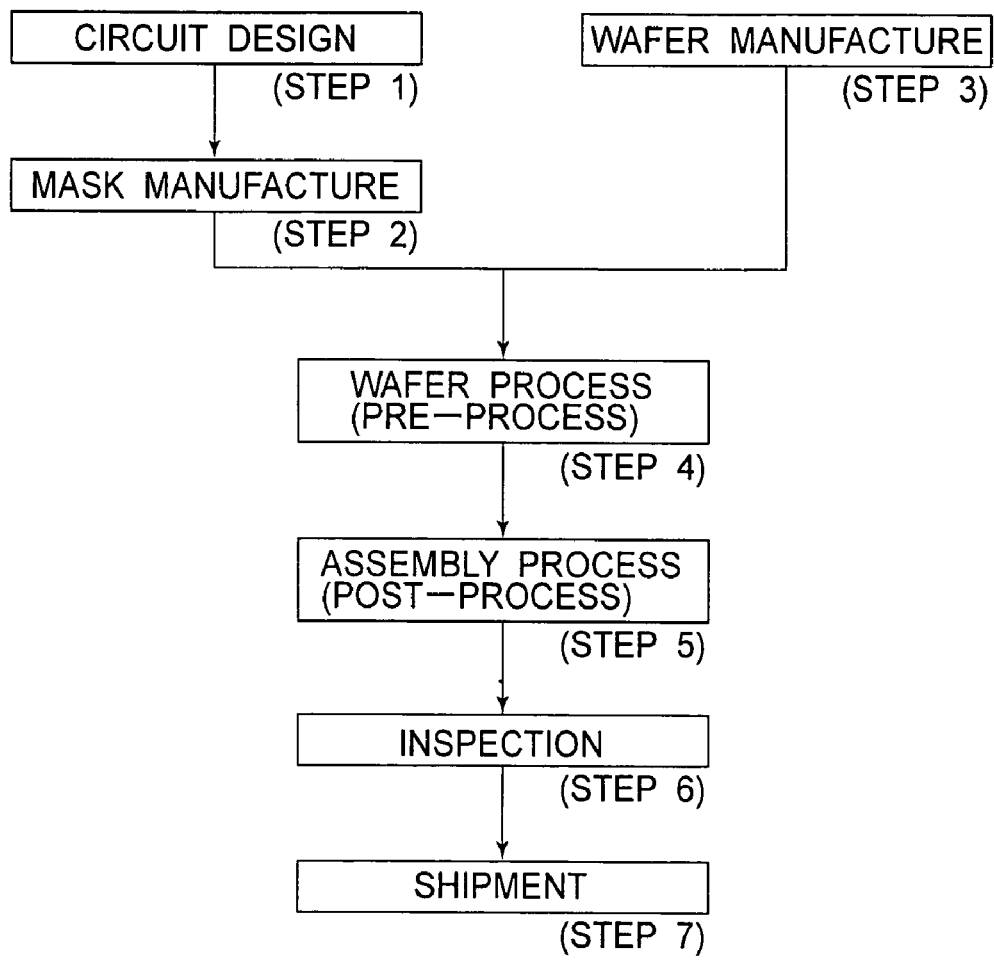
FIG. 5 is a flow chart for explaining device manufacturing processes in accordance with an embodiment of the present invention.

FIG. 5 is a flow chart for explaining the overall procedure for semiconductor device manufacture. Step 1 is a design process for designing a circuit of a semiconductor device. Step 2 is a process for making a mask on the basis of the circuit pattern design.

On the other hand, Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography.

Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and finally, they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth, and this application is intended to cover such modifications or changes as may come within the purposes of the improvements or the scope of the following claims.

What is claimed is:

1. A device manufacturing apparatus comprising:
conveying means configured to hold a substrate, using a reduced pressure, and to convey the substrate;
acquiring means configured to acquire an amount of warpage of the substrate, based on a measurement or an input;
storing means configured to store a database representing a correspondence between one of a conveying speed of said conveying means and a level of the reduced pressure, with the warpage amount of the substrate; and
control means configured to control, based on the database, said conveying means to convey the substrate in accordance with one of the conveying speed and the level of the reduced pressure, corresponding to the warpage amount acquired by said acquiring means.

2. An apparatus according to claim 1, further comprising (i) discriminating means configured to discriminate whether conveyance of the substrate by said conveying means is practicable, on the basis of the warpage amount of the substrate acquired by said acquiring means and information stored in said storing means, and (ii) notifying means configured to notify the result of the discrimination made by said discriminating means.

3. A scanning exposure apparatus comprising:
a stage configured to hold a substrate, using a reduced pressure, and to scan the substrate;
acquiring means configured to acquire an amount of warpage of the substrate in a state not held by said stage, based on a measurement or an input; and
control means configured to predict a distortion amount of the substrate remaining therein as the substrate is held by said stage, based on the warpage amount acquired by said acquiring means, and to change a scanning speed of said stage, based on the result of the prediction, to compensate for the distortion amount.

4. A scanning exposure apparatus comprising:
a stage configured to hold a substrate, using a reduced pressure, and to scan the substrate;
acquiring means configured to acquire an amount of warpage of the substrate, in a state not held by said stage, based on a measurement or an input;
predicting means configured to predict a distortion amount of the substrate remaining therein as the substrate is held by said stage, on the basis of the warpage amount of the substrate acquired by said acquiring means;
correction discriminating means configured to discriminate whether the distortion of the substrate is correctable through the scan of said stage, on the basis of the result of the prediction made by said predicting means; and
correction notifying means configured to notify the result of the discrimination made by said correction discriminating means.

5. A scanning exposure apparatus comprising:
a stage configured to hold a substrate using a reduced pressure and to scan the substrate;
acquiring means configured to acquire an amount of warpage of the substrate in a state not held by said stage, based on a measurement or an input;
predicting means configured to predict a distortion amount of the substrate remaining therein as the substrate is held by said stage, on the basis of the warpage amount of the substrate acquired by said acquiring means;
storing means configured to store a threshold related to the distortion amount of the substrate; and
selecting means configured to compare the distortion amount predicted by said predicting means and the threshold stored in said storing means, and to select, out of a plurality of marks, a mark to be used for alignment of the substrate, on the basis of the result of the comparison.

6. A device manufacturing method comprising:
a step of holding a substrate by a stage, using a reduced pressure;
a step of conveying the substrate by the stage;
a step of acquiring an amount of warpage of the substrate, based on a measurement or an input;
a step of storing a database representing a correspondence between one of a conveying speed in said conveying step and a level of the reduced pressure, with the warpage amount of the substrate; and
a step of controlling, based on the database, conveyance of the substrate in said conveying step, in accordance with one of the conveying speed and the level of the reduced pressure, corresponding to the warpage amount acquired in said acquiring step.

7. A scanning exposure method comprising:
a step of holding a substrate by a stage, using a reduced pressure;
a step of scanning the substrate by the stage;
a step of acquiring an amount of warpage of the substrate in a state not held by the stage, based on a measurement or an input;
a step of predicting a distortion amount of the substrate remaining therein as the substrate is held by the stage, based on the warpage amount acquired in said acquiring step; and
a step of changing a scanning speed of the stage, based on the result of the prediction, to compensate for the distortion amount.

8. A scanning exposure method comprising:
- a step of holding a substrate by a stage, using a reduced pressure;
- a step of scanning the substrate by the stage;
- a step of acquiring an amount of warpage of the substrate, based on a measurement or an input;
- a step of predicting at least one of a distortion amount of the substrate remaining therein as the substrate is held by the stage, on the basis of the warpage amount of the substrate acquired in said acquiring step;
- a step of discriminating whether the distortion of the substrate is correctable through the scan of the stage, on the basis of the result of the prediction made in said predicting step; and
- a step of notifying the result of a discrimination made in said discriminating step.

9. A scanning exposure method comprising:
- a step of holding a substrate by a stage, using a reduced pressure;
- a step of scanning the substrate by the stage;
- a step of acquiring an amount of warpage of the substrate in a state not held by the stage, based on a measurement or an input;
- a step of predicting a distortion amount of the substrate remaining therein as the substrate is held by the stag; on the basis of the warpage amount of the substrate acquired in said acquiring step;
- a step of storing a threshold related to the distortion amount of the substrate;
- a step of comparing the distortion amount predicted in said predicting step and the threshold stored in said storing step; and
- a step of selecting, out of a plurality of marks, a mark to be used for alignment of the substrate, on the basis of the result of the comparing.

\* \* \* \* \*